United States Patent [19]

Sugawa et al.

[11] Patent Number: 4,751,559
[45] Date of Patent: Jun. 14, 1988

[54] PHOTOELECTRIC CONVERSION DEVICE

[75] Inventors: Shigetoshi Sugawa, Atsugi; Nobuyoshi Tanaka, Tokyo; Toshiji Suzuki, Machida, all of Japan

[73] Assignee: Canon Kabushiki Kaisha, Japan

[21] Appl. No.: 927,874

[22] Filed: Nov. 7, 1986

[30] Foreign Application Priority Data

Nov. 13, 1985 [JP] Japan .................... 60-252653

[51] Int. Cl.$^4$ .................. H01L 27/14; H01L 29/72
[52] U.S. Cl. ........................ 357/30; 357/36; 357/34; 358/212; 358/213.23
[58] Field of Search ........... 357/30 D, 30 G, 30 P, 357/30 R, 36, 23.6, 34; 358/212, 211.23, 211.26, 211.29

[56] References Cited
U.S. PATENT DOCUMENTS 3,911,269 10/1975 Hart et al. .................. 357/30 G
4,408,304 10/1983 Nishizawa et al. .......... 357/40
4,445,130 4/1984 Poulain et al. ............. 357/58
4,686,554 8/1987 Ohmi et al. ................ 357/30

Primary Examiner—Martin H. Edlow
Assistant Examiner—D. Featherstone
Attorney, Agent, or Firm—Fitzpatrick, Cella, Harper & Scinto

[57] ABSTRACT

A photoelectric conversion device having electric conversion cells capable of performing a store operation, a read operation and a refresh operation. In the store operation, a potential of a control electrode region of a semiconductor transistor is controlled using a capacitor and carriers are stored, which carriers have been generated by light excitation at the control electrode region. In the read operation, a signal under control of a voltage generated by the stored carriers is read out of a main electrode area of the semiconductor transistor. In the refresh operation, carriers stored in the control electrode region are removed. A semiconductor region of the same conductivity type as the main electrode region, is formed in the control electrode region separately from the main electrode region.

1 Claim, 5 Drawing Sheets

FIG. IA
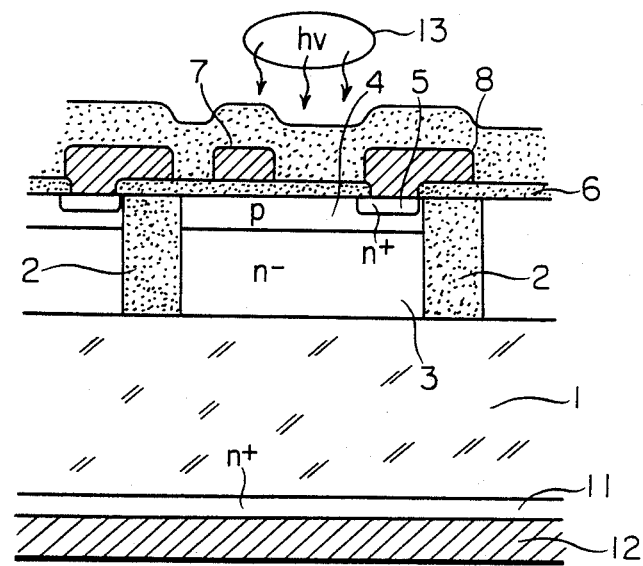
FIG. IB
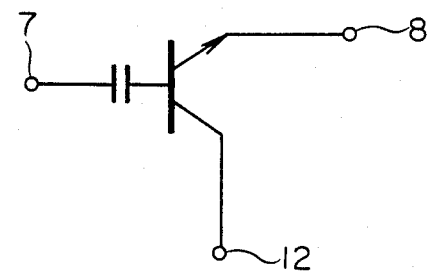

PHOTOELECTRIC CONVERSION DEVICE

BACKGROUND OF THE INVENTION

1. Field of the Invention

The present invention relates to a photoelectric conversion device having photoelectric conversion cells wherein potential at the control electrode region of the transistor is controlled through a capacitor, carriers generated upon light excitation at the control electrode are stored to control the output of the transistor by the potential generated by the stored carriers.

2. Related Background Art

FIG. 1A is a diagrammatical cross section of a photoelectric conversion device disclosed in EP Laid-Open Publication No. 132076, and FIG. 1B is an equivalent circuit of a photoelectric conversion cell of the device.

In the figures, photoelectric conversion cells are disposed on an n+ silicon substrate 1, each photoelectric conversion cell being electrically isolated from adjacent cells by an element isolation region 2 made of such as $SiO_2$, $Si_3N_4$ or polysilicon.

Each photoelectric conversion cell is constructed as follows.

On an n− region 3 having a low concentration of the impurity and formed using epitaxial technology or the like, a p region 4 is formed by doping p-type impurities into the n− region 3. An n+ region 5 is formed within the p region 4 using the impurity diffusion technology, or ion implanting technology. The p region 4 and N+ region 5 respectively correspond to the base and emitter of the bipolar transistor.

Formed on the n− region 3 is an oxidation layer 6 on which a capacitor electrode 7 having a predetermined area is formed. The capacitor electrode 7 confronts the p region 4, the oxidation layer 6 being interposed therebetween, and controls potential of the floating p region 4 by applying a pulse voltage thereto.

Also formed on the photoelectric conversion device are an emitter electrode 8 connected to the n+ region 5, an n+ region 11 having a high concentration of the impurity and formed on the back of the substrate 1, and a collector electrode 12 for supplying a collector potential to the bipolar transistor.

Next, the fundamental operation of the photoelectric conversion device will be described. It is assumed that the p region 4 serving as the base of the bipolar transistor has a negative potential as its initial condition. Light 13 is applied to the p region 4 to generate electron-hole pairs. Holes are stored in the p region 4 so that the potential of the p region 4 becomes positive (store operation).

In this condition, a positive pulse voltage is applied to the capacitor electrode 7 for reading light information. That is, a signal representing the received light information and corresponding to the base potential change during the store operation is outputted from the electrode 8 of the floating emitter (read operation). In this case, a non-destructive read operation is possible since the stored charge in the base or p region 4 is scarcely reduced.

To remove holes stored in the p region 4, the emitter electrode is grounded and the capacitor electrode 7 is applied with a positive refresh pulse voltage. Upon application of this pulse, the p region 4 is forward biased relative to the n+ region 5 to accordingly remove stored holes. After the refresh pulse falls, the p region 4 resumes the initial condition of negative potential (refresh operation). Thereafter, similar store, read and refresh operations are repeated.

In summary, according to the above method, carriers generated by incident light are stored in the base or p region 4, and current passing between the emitter electrode 8 and the collector electrode 12 is controlled by the quantity of stored charges. Since stored carriers are amplified by the amplification function of the cell itself, a large output, high sensitivity and low noise can be realized.

Base potential Vp generated by light-excited carriers of the base is given by Q/C, where Q is the charge quantity of carriers stored in the base, and C is the capacitance of the base. As the cell size becomes small due to high integration density, the values of Q and C become small. Thus, as is apparent from the formula, the potential Vp generated by light excitation remains substantially constant. Therefore, it can be said that the above-proposed method is advantageous for obtaining a high resolution of the device.

With such a photoelectric conversion device, only light information stored in a photoelectric conversion cell is read from the emitter electrode. Therefore, it is necessary to measure the quantity of light or detect a peak value prior to a read operation, resulting in an obstacle to high speed operation. Further, there arises a problem that the circuit for regulating exposure time and gain based on the detected value becomes complicated in its construction and operation.

SUMMARY OF THE INVENTION

An object of the present invention is to provide an improved photoelectric conversion device capable of solving the above problems.

Another object of the present invention is to provide a photoelectric conversion device capable of operating at high speed.

A further object of the present invention is to provide a photoelectric conversion device wherein the circuit for regulating exposure time or gain based on the detected value obtained by measuring light quantity or of a peak value, can be simplified in construction and operation.

Accordingly, the present invention is provided a photoelectric conversion device having electric conversion cells capable of performing a store operation, a read operation and a refresh operation. In the store operation, a potential of a control electrode region of a semiconductor transistor is controlled using a capacitor and carriers generated by light excitation at the control electrode region are stored. In the read operation, a signal under control of a voltage generated by the stored carriers is read out of a main electrode area of the semiconductor transistor, and in the refresh operation, carriers stored in the control electrode region are removed. A semiconductor region of the same conductivity type as said main electrode region, is formed in said control electrode region separately from said main electrode region.

These and other objects, features and advantages of the invention will be more fully appreciated from the following detailed description of the preferred embodiment, taken in conjunction with the accompanying drawings.

BRIEF DESCRIPTION OF THE DRAWINGS

FIG. 1A is a diagrammatical cross section of a photoelectric conversion device disclosed in EP Laid-Open Publication No. 132076;

FIG. 1B is an equivalent circuit of a photoelectric conversion cell of the device shown in FIG. 1A;

DETAILED DESCRIPTION OF THE PREFERRED EMBODIMENT

The preferred embodiment of the present invention will now be described with reference to the accompanying drawings.

Figure 2A:
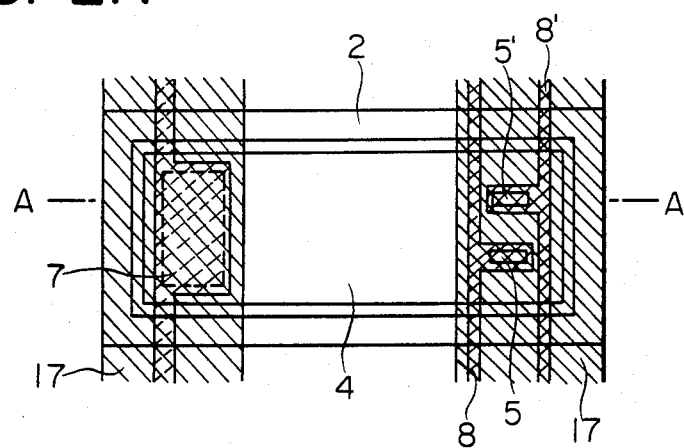
FIG. 2A is a diagrammatical plan view of an embodiment of the photoelectric conversion device according to the present invention.
Figure 2B:
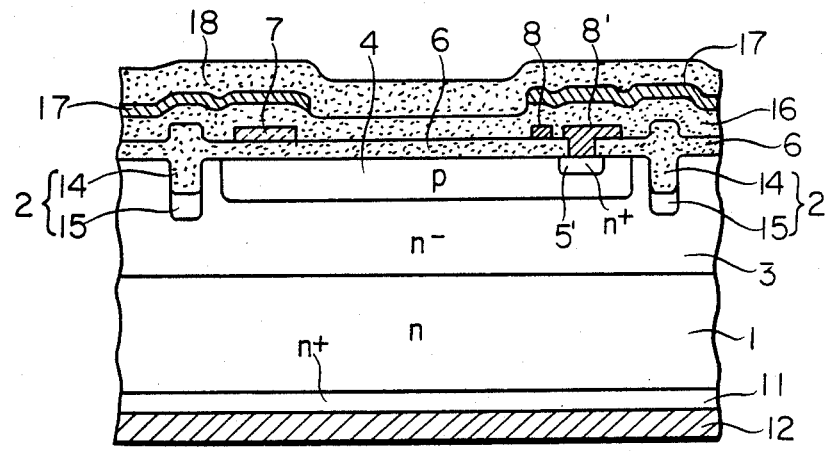
FIG. 2B is a cross section along line A—A of FIG. 2A.
Figure 2C:
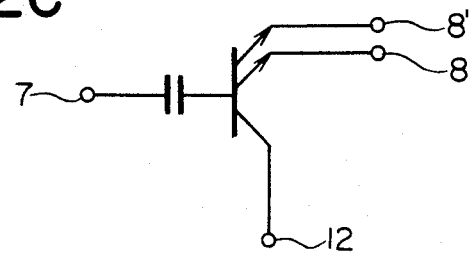
FIG. 2C is an equivalent circuit of a photoelectric conversion element of the device shown in FIGS. 2A and 2B.

FIG. 2A is a diagrammatical plan view of an embodiment of the photoelectric conversion device according to the present invention, FIG. 2B is a cross section along line A—A of FIG. 2A, and FIG. 2C is an equivalent circuit of a photoelectric conversion element of the device shown in FIGS. 2A and 2B. Like regions and elements having the same function as of the example of FIG. 1 have been designated using identical numerals, and the description therefore is omitted.

In the figures, a p base region 4 is formed in an n⁻ epitaxial layer 3, and n+ emitter regions 5 and 5' are formed in the p base region 4. Emitter electrodes 8 and 8' are connected to the n+ regions 5 and 5', respectively.

In this embodiment, an element isolation region 2 is constructed of an insulation region 14 and an n+ region 15 formed just under the insulation region 14, and electrically isolates adjacent photoelectric conversion cells.

A capacitor electrode 7 is formed on the p base region 4, an exidation layer 6 being interposed therebetween. The areas where the capacitor electrode and emitter electrodes are formed, and shielded from light by a light shielding layer 17 so that a light receiving surface is formed on the main area of the p base region 4. A passivation layer 18 is formed on the light shielding layer 17 and the insulation layer 16 which serves as the light receiving surface.

In this embodiment, two emitter regions have been formed. The present invention, however, is not limited threreto but a plurality of emitter regions may be formed for specific purposes.

The fundamental operation of this embodiment, including store, read and refresh operations, is similar to that disclosed in the above EP Laid-open Publication. However, with this embodiment, light information can be separately read because two emitter regions are formed, and this enables application to the following image pickup device.

Figure 3A:
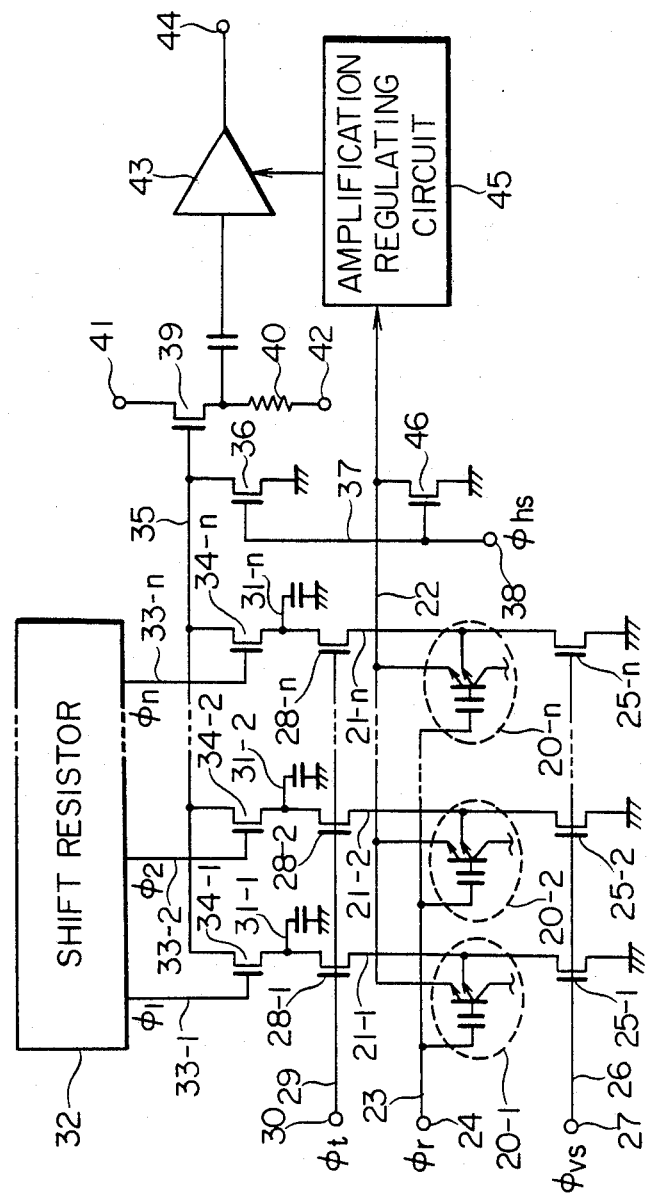
FIG. 3A is a circuit diagram showing an example of an image pickup device using the embodiment of the present invention.
Figure 3B:
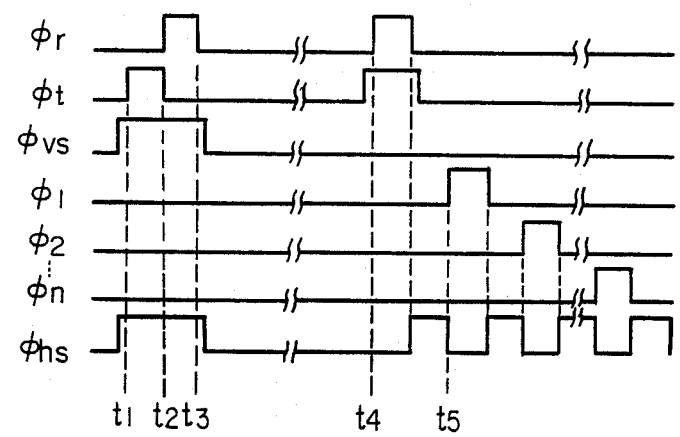
FIG. 3B is a timing chart illustrating the operation of the image pickup device.

FIG. 3A is a circuit diagram showing an example of an image pickup device using the embodiment of the present invention, and FIG. 3B is a timing chart illustrating the operation of the image pickup device.

In the figures, n photoelectric conversion cells 20-1 to 20-n are disposed one-dimensionally, the collector electrodes 12 of the cells being connected in common to which a positive voltage or a ground potential is applied. Capacitor electrodes 7 are connected in common via a line 23 to a terminal 24 to which a signal $\phi_r$ for read or refresh operation is applied. One emitters 8 are respectively connected to vertical lines 21-1 to 21-n, while the other emitters 8' are connected to a common line 22.

The vertical liens 21-1 to 21-n are grounded via respective transistors 25-1 to 25-n. The gate electrodes of the transistors 25-1 to 25-n are connected in common via line 26 to a terminal 27 to which a signal $\phi_{vs}$ is applied.

The vertical lines 21-1 to 21-n are also respectively connected to one main electrodes of transistors 28-1 to 28-n, which are connected in common via line 29 to a terminal 30 to which a signal $\phi_t$ is applied. The other main electrodes of the transistors 28-1 to 28-n are respectively grounded via charge store capacitors 31-1 to 31-n, and are respectively connected to an output line 35 via transistors 34-1 to 34-n.

The gate electrodes of the transistors 34-1 to 34-n are respectively connected to parallel output terminals 33-1 to 33-n of a shift register 32, signals $\phi_1$ to $\phi_n$ being outputted from the parallel output terminals.

The output line 35 is grounded via a transistor 36 which resets the output line 35, and connected to the gate electrode of a transistor 39 serving as an output amplifier. The gate electrode of the reset transistor 36 is connected via a line 37 to a terminal 38 to which a signal $\phi_{hs}$ is applied. One main electrodes of the transistor 39 are connected to a positive voltage terminal 41, while the other main electrodes are connected via resistor 40 to a negative voltage terminal 42. The other vain electrodes are also connected to the input terminal of an amplifier 43 which outputs read light information from its output terminal 44. A capacitor coupling the amplifier 43 may be omitted depending on the potential of an operating point.

The common line 22 is grounded via transistor 46, and connected to the input terminal of an amplification regulating circuit 45. The gate electrode of the transistor 46 is connected via the line 37 to a terminal 38 to which the same signal $\phi_{hs}$ applied to the transistor 36 is applied. The output terminal of the amplification regulating circuit 45 is connected to an amplification select terminal of the amplifier 43 which regulates the amplification factor of the amplifier based on an input signal from the common line 22.

The operation of the embodiment thus constructed will be described with reference to FIG. 3B. (Refresh Operation)

First, the transistors 25-1 and 25-n and reset transistors 36 and 46 are rendered ON by applying high level signals of $\phi_{vs}$ and $\phi_{hs}$. Then, the emitter electrodes 8 and 8' of the photoelectric conversion cells 20-1 and 20-n become grounded. Succeedingly, at time $t_1$, the signal $\phi_t$ becomes high level to make the transistors 28-1 to 28-n turn ON so that the charge store capacitors 31-1 to 31-n become grounded to thereby remove residual charges. Thereafter, at time $t_2$, the pulse signal $\phi_t$ falls and the signal $\phi_r$ becomes high level so that a positive refresh voltage is applied to the capacitor electrodes of the photoelectric conversion cells 20-1 to 20-n. Since the emitter electrodes 8 and 8' are being grounded, a refresh operation is achieved as previously described. When the signal $\phi_r$ falls at time $\phi_3$, the base region 4 of each photoelectric conversion cell resumes its initial condition. After a refresh operation, the signals $\phi_{vs}$ and $\phi_{hs}$ fall, and the transistors 25-1 and 25-n and 28-1 and 28-n become turned OFF.

(STORE OPERATION)

With the above condition, holes among electron hole pairs generated by incident light are stored in the base region 4 of each photoelectric conversion cell 20-1 to 20-n, so that the base potential of each cell rises from its initial negative potential, by the amount of the stored voltage corresponding to the incident light quantity.

(READ OPERATION)

After performing a store operation for a desired time, first the signal $\phi_t$ is rendered high level to make the transistors 28-1 to 28-n turn ON. Thus, the vertical lines 21-1 to 21-n are respectively made connected to charge store capacitors 31-1 to 31-n.

Succeedingly, at time $t_4$, the signal $\phi_r$ rises to apply a read positive voltage to the capacitor electrode 7 of each photoelectric conversion cell. Thus, a read operation as described previously is performed where light information of the photoelectric conversion cells 20-1 to 20-n is read and stored in the charge store capacitors 31-1 to 31-n and delivered onto the common line 22.

In this case, light information of the photoelectric conversion cells 20-1 to 20-n is read and stored in the respective charge store capacitors 31-1 to 31-n, whereas on the common line 22, the light information of the photoelectric conversion cell to which the largest quantity of incident light has been applied, appears as a peak voltage. Based on this peak voltage, the amplification regulating circuit 45 regulates the amplification factor of the amplifier 43 to suppress a signal quantity difference between high and low level light signals and realize an automatic stop.

After completion of regulating the amplification factor of the amplifier 43, the signals $\phi_r$ and $\phi_t$ fall, and the pulse signal $\phi_{hs}$ is applied to the terminal 38. Then, the transistors 28-1 to 28-n are rendered OFF, and the common line 22 and the output line 35 are reset.

Thereafter, from time $t_5$, the shift register 32 is activated to sequentially read stored light information from the charge store capacitors 31-1 to 31-n. First, when the signal $\phi_1$ outputted from the output terminal 33-1 of the shift register 32 becomes high level, the transistor 34-1 is rendered ON so that the light information stored in the charge store capacitor 31-1 is read onto the output line 35. The read-out light information is inputted via the transistor 39 to the amplifier 43, whose amplification factor has already been regulated, and outputted from the terminal 44. Succeedingly, when the signal $\phi_1$ falls, the signal $\phi_{hs}$ becomes high level so that the output line 35 is grounded via the transistor 36 to thereby remove residual charges.

Similarly, the signals $\phi_2$ to $\phi_n$ outputted from the shift register 32 sequentially become high level, light information stored in the charge store capacitors 31-2 to 31-n are sequentially read, and the output line 35 is reset every time light information is read and the signal $\phi_{hs}$ becomes high level. In such a manner, light information of all the photoelectric conversion cells 20-1 to 20-n is serially outputted from the amplifier 43 with a regulated amplification factor. The refresh, store and read operations are repeated in the similar manner as above, during which a peak value is detected every time a read operation is to be performed, to regulate the amplification factor of the amplifier 43.

As appreciated, since a read operation for light information and a peak value detecting operation are carried out in parallel, it is possible to achieve a high speed operation as a whole.

Figure 4B:
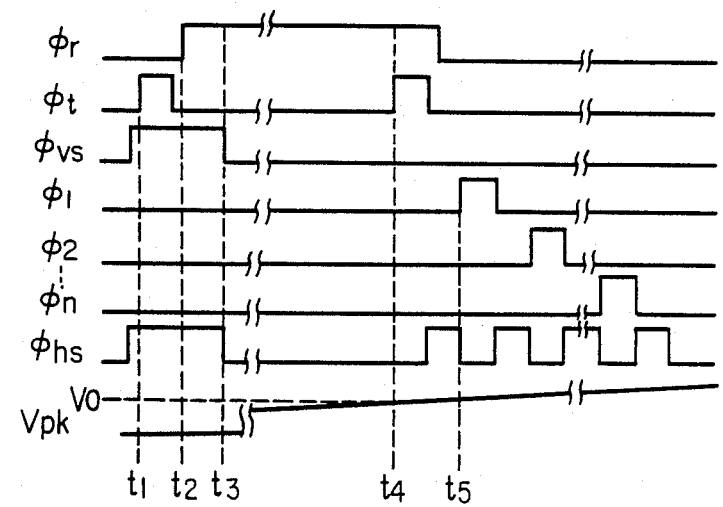
FIG. 4B is a timing chart illustrating the operation of the image pickup device shown in FIG. 4A.
Figure 4A:
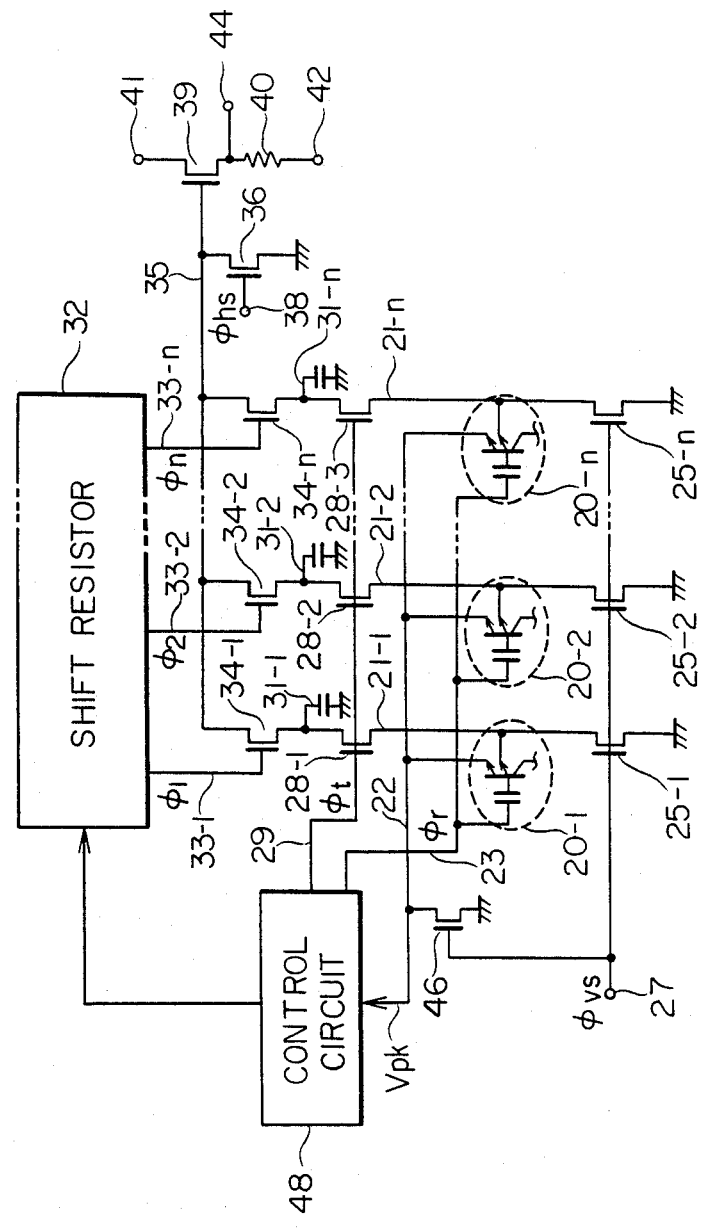
FIG. 4A is a circuit diagram showing another example of an image pickup device using the embodiment of the present invention.

FIG. 4A is a circuit diagram showing another example of a image pickup device using the embodiment of the present invention, and FIG. 4B is a timing chart illustrating the operation of the image pickup device shown in FIG. 4A. Like elements to those in the circuit of FIG. 3A have been designated using identical symbols of numerals, and the description therefor is omitted.

Referring to FIG. 4A, bipolar transistors of photoelectric conversion cells 20-1 to 20-n have a current amplification factor sufficiently large enough for reducing carrier decay in a base region 4, as described later. Emitter electrodes 8' of the photoelectric conversion cells 20-1 to 20-n are connected in common to a common line 22, grounded via reset transistor 46, and connected to a control circuit 48. The gate electrode of the transistor 46 is connected to a terminal 27 to which a signal $\phi_{vs}$ is applied.

The control circuit 48 outputs signals $\phi_t$ and $\phi_4$ to lines 29 and 23, respectively. As described later, the signal $\phi_t$ during a read operation is outputted when a voltage Vpk at the common line 22 reaches a set voltage $V_0$. The control circuit 48 also outputs a control signal to a shift register 32.

The remaining circuit arrangement is the same as that of the circuit shown in FIG. 3A except the amplifier 43 and the amplification regulating circuit 45.

Next, the operation of the image pickup device constructed as above will be described with reference to FIG. 4B.

First, the transistors 25-1 and 25-n and reset transistors 36 and 46 are rendered ON by applying high level signals of $\phi_{vs}$ and $\phi_{hs}$. Then, the emitter electrodes 8 and 8' of the photoelectric conversion cells 20-1 and 20-n are grounded so that the potential Vpk of the common line 22 takes a ground potential.

Succeedingly, at time $t_1$, the signal $\phi_t$ becomes high level to make the transistors 28-1 to 28-n turn ON so that the charge store capacitors 31-1 to 31-n are grounded to remove residual charges. Thereafter, after the pulse signal $\phi_t$ falls, the signal $\phi_r$ becomes high level at time $t_2$ so that a positive refresh voltage is applied to the capacitor electrodes of the photoelectric conversion cells 20-1 to 20-n. Since the emitter electrodes 8 and 8' are being grounded, a refresh operation is achieved as previously described.

The refresh operation terminates at time $t_2$, with the signals $\phi_{vs}$ and $\phi_{hs}$ falling off and the transistors 25-1 to 25-n and 28-1 to 28-n being rendered OFF. However, the signal $\phi_r$ remains high level so that the capacitor electrode 7 of each photoelectric conversion cell continues to be applied with a positive voltage. When a store operation starts in this condition, a read operation is also carried out in parallel so that light information voltages corresponding to the incident light quantities appear at the emitter electrodes 8 and 8'. In this case, although the holes stored in the base region 4 of each photoelectric conversion cell decays due to recombination by $1/h_{fe}$, the decay of holes by recombination can be neglected because of a sufficiently large current amplification factor $h_{fe}$.

Each emitter electrode 8 takes a voltage of each light information of the photoelectric conversion cells 20-1 to 20-n because the transistors 28-1 to 28-n and 25-1 to 25-n are OFF. Contrary to this, each emitter electrode 8' takes a peak voltage Vpk among those light information because the emitter electrode 8' is connected to the common line 22.

A change in the peak voltage Vpk is detected by the control circuit 48. When the peak voltage Vpk reaches a preset voltage $V_0$ (time $t_4$), the control circuit 48 makes the signal $\phi_t$ high level and makes the transistors 28-1 to 28-n turn ON. Then, the store operation terminates where light information appearing at the vertical lines 21-1 to 21-n is stored in the charge store capacitors 31-1 to 31-n. The following operation (after time $t_5$) for sequentially outputting light information stored in the charge store capacitors 31-1 to 31-n, is similar to that of the first example shown in FIG. 3B.

In the second example of the image pickup device, a peak voltage Vpk is detected from the emitter electrode 8', and the period of a store operation is controlled based on the peak voltage Vpk. Therefore, similar to the first example, it is possible to suppress the signal quantity difference between high and low level light signals and realize an automatic stop function. It is obvious that the second example can be applied to the first example to regulate the amplification faactor of the amplifier 43 based on the peak voltage Vpk.

In the above embodiment, although the photoelectric conversion cells have been diposed one-dimensionally as a line sensor, obviously the present invention is also applicable to an area sensor having cells disposed two-dimensionally.

As seen from the foregoing description, the photoelectric conversion device according to the present invention can read light information from a semiconductor region provided separately from the electrode region. Therefore, light information can be read from the main electrode region and also from the semiconductor region. Thus, semiconductor region can be used, for example, in measuring the incident light quantity or detecting a peak value. Consequently, measuring the incident light quantity or detecting a peak value can be carried out in parallel with other operations such as a store operation or a read operation, resulting in high speed operation of the device. Further, use of a circuit for processing light information based on such detected value, enable a stable read of light information and a simplified design of a signal processing circuit at the following stage.

We claim:

1. A photoelectric conversion device comprising:
a plurality of photoresponsive transistors, each of said photoresponsive transistors having a base region which stores photo-excited carriers, a first emitter region, a second emitter region and a collector region;
a signal line for connecting in parallel said base regions of said plurality of photoresponsive transistors;
transfer means electrically coupled with said first emitter region of each photoresponsive transistor for sequentially transferring an output signal based on an output of each first emitter region;
peak output detection means electrically coupled with said second emitter region of each photoresponsive transistor for detecting a peak output of output signals provided upon operation of said transfer means by each second emitter region.

* * * * *

UNITED STATES PATENT AND TRADEMARK OFFICE
CERTIFICATE OF CORRECTION

PATENT NO. : 4,751,559

DATED : June 14, 1988

INVENTOR(S) : SHIGETOSHI SUGAWA, ET AL.

It is certified that error appears in the above-identified patent and that said Letters Patent is hereby corrected as shown below:

COLUMN 1

Line 30, "N+" should read --n+--.

COLUMN 2

Line 46, "is provided" should read --provides--.

COLUMN 3

Line 51, "exidation" should read --oxidation--.
Line 54, "and" should read --are--.
Line 62, "threreto" should read --thereto--.

COLUMN 4

Line 17, "liens" should read --lines--.
Line 42, "vain" should read --main--.
Line 59, "(Refresh" should be deleted.
Line 60, "Operation)" should read --(REFRESH OPERATION)-- and should be centered as a heading.

COLUMN 6

Line 14, "a" should read --an--.
Line 19, "of" should read --or--.
Line 31, "$\phi_4$" should read --$\phi_r$--.
Line 59, "time $t_2$," should read --time $t_3$,--.

UNITED STATES PATENT AND TRADEMARK OFFICE
CERTIFICATE OF CORRECTION

PATENT NO. : 4,751,559

DATED : June 14, 1988

INVENTOR(S) : SHIGETOSHI SUGAWA, ET AL.

It is certified that error appears in the above-identified patent and that said Letters Patent is hereby corrected as shown below:

COLUMN 7

Line 34, "faactor" should read --factor--.
Line 37, "diposed" should read --disposed--.

Signed and Sealed this

Twenty-first Day of February, 1989

Attest:

DONALD J. QUIGG

Attesting Officer

Commissioner of Patents and Trademarks